(12) United States Patent
Kou

(10) Patent No.: US 7,015,713 B2
(45) Date of Patent: Mar. 21, 2006

(54) METHOD AND APPARATUS FOR EVALUATING A SET OF ELECTRONIC COMPONENTS

(75) Inventor: Yuen-Foo Michael Kou, Melrose, MA (US)

(73) Assignee: Accu-Assembly Incorporated, Andover, MA (US)

( * ) Notice: Subject to any disclaimer, the term of this patent is extended or adjusted under 35 U.S.C. 154(b) by 0 days.

(21) Appl. No.: 10/884,614

(22) Filed: Jul. 2, 2004

(65) Prior Publication Data
US 2004/0239360 A1 Dec. 2, 2004

Related U.S. Application Data

(62) Division of application No. 09/924,279, filed on Aug. 8, 2001, now Pat. No. 6,759,862.

(51) Int. Cl.
G01R 31/02 (2006.01)
(52) U.S. Cl. .................... 324/763; 324/113; 324/158.1; 700/90; 700/117
(58) Field of Classification Search ................. 374/28, 374/45; 360/133; 702/130, 101; 324/102, 324/112, 113, 760, 763, 73
See application file for complete search history.

(56) References Cited

U.S. PATENT DOCUMENTS

| 4,165,633 A | * | 8/1979 | Raisanen ........................ 73/76 |
| 4,242,632 A | | 12/1980 | Irvin |
| 4,298,946 A | * | 11/1981 | Hartsell et al. ............. 700/278 |
| 4,426,619 A | | 1/1984 | Demand |
| 4,684,884 A | | 8/1987 | Soderlund |
| 4,728,885 A | | 3/1988 | DeSanto |
| 4,922,433 A | * | 5/1990 | Mark .......................... 700/284 |
| 4,939,469 A | | 7/1990 | Ludwig et al. |
| 5,024,532 A | | 6/1991 | Rall |
| 5,434,737 A | | 7/1995 | Miura |
| 5,450,018 A | | 9/1995 | Rieser et al. |
| 5,606,264 A | | 2/1997 | Licari et al. |
| 5,682,684 A | * | 11/1997 | Wentzlaff et al. ............. 34/495 |
| 5,716,272 A | * | 2/1998 | Nelson ......................... 460/7 |
| 5,764,073 A | | 6/1998 | Sadamatsu |
| 5,867,809 A | | 2/1999 | Soga et al. |
| 6,002,650 A | * | 12/1999 | Kuribayashi et al. ....... 700/117 |
| 6,035,710 A | * | 3/2000 | Hutchison et al. ....... 73/170.16 |
| 6,055,008 A | * | 4/2000 | Bliss .......................... 347/133 |
| 6,113,262 A | | 9/2000 | Purola et al. |
| 6,560,839 B1 | | 5/2003 | Tow et al. |
| 6,759,862 B1 | * | 7/2004 | Kou ........................... 324/763 |
| 6,778,878 B1 | * | 8/2004 | Kou ........................... 700/221 |

(Continued)

FOREIGN PATENT DOCUMENTS

JP 61-068514 4/1986

(Continued)

OTHER PUBLICATIONS

"Cytherm Temperature Data Logger Key", Dynasys Technologies Inc.

(Continued)

Primary Examiner—Paresh Patel
(74) Attorney, Agent, or Firm—Fish & Richardson P.C.

(57) ABSTRACT

A method is disclosed of monitoring an environmental condition associated with a container with a set of electronic components including attaching a moisture recorder to the container, the moisture recorder comprising a sensing element responsive to atmospheric moisture content, a memory storage device, and a processor electrically coupled to the sensing element and the memory storage device, the processor being configured to periodically receive information from the sensing element indicative of atmospheric moisture content and to store data in the memory storage device based on the received information.

11 Claims, 11 Drawing Sheets

U.S. PATENT DOCUMENTS

| | | | |
|---|---|---|---|
| 6,879,869 B1 * | 4/2005 | Kou | 700/117 |
| 2002/0013635 A1 * | 1/2002 | Gotou et al. | 700/108 |
| 2003/0030429 A1 * | 2/2003 | Koy | 324/158.1 |
| 2004/0193302 A1 * | 9/2004 | Kou | 700/114 |
| 2004/0239360 A1 * | 12/2004 | Kou | 324/763 |

FOREIGN PATENT DOCUMENTS

| | | |
|---|---|---|
| JP | 06042986 | 2/1994 |

OTHER PUBLICATIONS

"Dallas Semiconductor, DS2438 Smart Battery Monitor", www.dalsemi.com, Apr. 10, 2001, pp. 1-29.

"Humidity Sensors Relative Humidity", Honeywell HIH Series, pp. 99, 100.

"Joint Industry Standard", IPC/JEDEC J-STD-033, Apr. 1999.

"Microchip PIC12C67X", © 1999 Microchip Technology Inc.

Awtrey et al., "A1-Wire Humidity Sensor", Sensors The Journal of Applied Sensing Technology.

* cited by examiner

FIG. 7 (Prior Art)

| IPC/JEDEC J-STD-033 | | | | | | | | | | | April 1999 |
|---|---|---|---|---|---|---|---|---|---|---|---|
| TABLE 5 Recommended Equivalent Total Floor Life (days) @ 20°C, 25°C & 30°C For ICs with Novolac, Biphenyl and Multifunctional Epoxies (Reflow at same temperature at which the component was classified) | | | | | | | | | | | |
| | | Maximum Percent Relative Humidity | | | | | | | | | |
| Body Thickness (t) | M.S. Level | 20% | 30% | 40% | 50% | 60% | 70% | 80% | 90% | | |
| t ≥ 3.1mm<br>PQFPs > 84 pins.<br>PLCCs (square)<br>MQFPs<br>or PBGAs | Level 2a | ∞<br>∞<br>∞ | 60<br>78<br>103 | 41<br>53<br>69 | 33<br>42<br>57 | 28<br>36<br>47 | 10<br>14<br>19 | 7<br>10<br>13 | 6<br>8<br>10 | | 30°C<br>25°C<br>20°C |
| | Level 3 | 10<br>13<br>17 | 9<br>11<br>14 | 8<br>10<br>13 | 7<br>9<br>12 | 7<br>9<br>12 | 5<br>7<br>10 | 4<br>6<br>8 | 4<br>5<br>7 | | 30°C<br>25°C<br>20°C |
| | Level 4 | 4<br>5<br>7 | 4<br>5<br>7 | 4<br>5<br>7 | 3<br>5<br>7 | 3<br>4<br>6 | 3<br>3<br>5 | 2<br>3<br>4 | 2<br>3<br>4 | | 30°C<br>25°C<br>20°C |
| | Level 5 | 3<br>5<br>7 | 3<br>4<br>6 | 2<br>4<br>5 | 2<br>3<br>5 | 2<br>3<br>4 | 2<br>2<br>3 | 1<br>2<br>3 | 1<br>2<br>3 | | 30°C<br>25°C<br>20°C |
| | Level 5a | 1<br>2<br>4 | 1<br>2<br>3 | 1<br>2<br>3 | 1<br>2<br>3 | 1<br>2<br>2 | 1<br>1<br>2 | 1<br>1<br>2 | 1<br>1<br>2 | | 30°C<br>25°C<br>20°C |
| t ≤ 2.1mm<br>t ≤ 3.1mm<br>PLCCs (rectangular) 18-32 pins<br>SOICs (wide body)<br>SOICs ≥ 20 pins<br>PQFPs ≤ 80 pins | Level 2a | ∞<br>∞<br>∞ | ∞<br>∞<br>∞ | 86<br>148<br>∞ | 39<br>51<br>69 | 28<br>37<br>49 | 4<br>6<br>8 | 3<br>4<br>5 | 2<br>3<br>4 | | 30°C<br>25°C<br>20°C |
| | Level 3 | 19<br>25<br>32 | 12<br>15<br>19 | 9<br>12<br>15 | 8<br>10<br>13 | 7<br>9<br>12 | 3<br>5<br>7 | 2<br>3<br>5 | 2<br>3<br>4 | | 30°C<br>25°C<br>20°C |
| | Level 4 | 5<br>7<br>9 | 4<br>5<br>7 | 4<br>5<br>6 | 3<br>4<br>6 | 3<br>4<br>5 | 2<br>3<br>4 | 2<br>2<br>3 | 1<br>2<br>3 | | 30°C<br>25°C<br>20°C |
| | Level 5 | 3<br>4<br>5 | 3<br>3<br>5 | 2<br>3<br>4 | 2<br>3<br>4 | 2<br>3<br>4 | 1<br>2<br>3 | 1<br>1<br>3 | 1<br>1<br>2 | | 30°C<br>25°C<br>20°C |
| | Level 5a | 1<br>2<br>2 | 1<br>2<br>2 | 1<br>2<br>2 | 1<br>2<br>2 | 1<br>2<br>2 | 1<br>1<br>2 | 0.5<br>1<br>2 | 0.5<br>1<br>1 | | 30°C<br>25°C<br>20°C |
| t > 2.1mm<br>TSOPs,<br>SOICs < 18 pins<br>TQFPs or<br>or TBGAs | Level 2a | ∞<br>∞<br>∞ | ∞<br>∞<br>∞ | ∞<br>∞<br>∞ | ∞<br>∞<br>∞ | 28<br>∞<br>∞ | 1<br>2<br>2 | 1<br>1<br>2 | 1<br>1<br>1 | | 30°C<br>25°C<br>20°C |
| | Level 3 | ∞<br>∞<br>∞ | ∞<br>∞<br>∞ | ∞<br>∞<br>∞ | 11<br>14<br>20 | 7<br>10<br>13 | 1<br>2<br>2 | 1<br>1<br>2 | 1<br>1<br>1 | | 30°C<br>25°C<br>20°C |
| | Level 4 | ∞<br>∞<br>∞ | 9<br>12<br>17 | 5<br>7<br>9 | 4<br>5<br>7 | 3<br>4<br>6 | 1<br>2<br>2 | 1<br>1<br>2 | 1<br>1<br>1 | | 30°C<br>25°C<br>20°C |
| | Level 5 | 13<br>18<br>26 | 5<br>6<br>8 | 3<br>4<br>6 | 2<br>3<br>5 | 2<br>3<br>4 | 1<br>2<br>2 | 1<br>1<br>2 | 1<br>1<br>1 | | 30°C<br>25°C<br>20°C |
| | Level 5a | 3<br>5<br>6 | 2<br>3<br>4 | 1<br>2<br>3 | 1<br>2<br>2 | 1<br>2<br>2 | 1<br>1<br>2 | 1<br>1<br>2 | 0.5<br>1<br>1 | | 30°C<br>25°C<br>20°C |

| Package thickness | Level | Bake@125°C | Bake@40°c ≤5%RH |
|---|---|---|---|
| ≤1.4 mm | 2a | 4 hours | 5 days |
| | 3 | 7 hours | 11 days |
| | 4 | 9 hours | 13 days |
| | 5 | 10 hours | 14 days |
| | 5a | 14 hours | 19 days |
| ≤2.0 mm | 2a | 18 hours | 21 days |
| | 3 | 24 hours | 33 days |
| | 4 | 31 hours | 43 days |
| | 5 | 37 hours | 52 days |
| | 5a | 48 hours | 68 days |
| ≤4.0 mm | 2a | 48 hours | 67 days |
| | 3 | 48 hours | 67 days |
| | 4 | 48 hours | 68 days |
| | 5 | 48 hours | 68 days |
| | 5a | 48 hours | 68 days |

Table 2 Reference Conditions for Drying Components that were Exposed to Conditions ≤60% RH
(User Bake:Floor Life Begins Counting at Time=0 after bake)

FIG. 8
*(Prior Art)*

METHOD AND APPARATUS FOR EVALUATING A SET OF ELECTRONIC COMPONENTS

This application is a divisional of U.S. Ser. No. 09/924,279, filed Aug. 8, 2001, now U.S. Pat. No. 6,759,862.

BACKGROUND

Manufacturers often handle a large number of electronic components when assembling electronic devices. These electronic components can be susceptible to damage, especially during printed circuit board manufacturing processes, as a result of prolonged exposure to environments having high ambient moisture content. Ambient moisture can penetrate the bodies of moisture sensitive components and become trapped. During certain manufacturing processes, such as reflow, these electronic components are exposed to high temperatures. The high temperatures can cause the trapped moisture to expand and can damage the electronic components.

To minimize the occurrence of such damage, electronic components can be baked at elevated temperatures to remove at least some of the trapped moisture prior to reflow or exposure to other high temperatures.

SUMMARY OF THE INVENTION

In one broad aspect, a method is disclosed of monitoring an environmental condition associated with a container containing a set of electronic components. The method includes attaching a moisture recorder to the container, the moisture recorder having a sensing element responsive to atmospheric moisture content, a memory storage device, and a processor electrically coupled to the sensing element and to the memory storage device. The processor is configured to periodically receive information from the sensing element indicative of atmospheric moisture content and to store data in the memory storage device based on the received information.

In second broad aspect, a method is disclosed of evaluating a set of identical electronic components prior to installing the components into electronic assemblies. The method includes collecting data indicative of an environmental condition associated with the electronic components during multiple consecutive periods of time prior to installing the electronic components from the set into the electronic assemblies, storing the collected data and evaluating whether the electronic components are suitable for installation based on an estimated cumulative effect of exposure to the environmental condition based on the stored data.

In another broad aspect, a container of electronic components to be installed into electronic assemblies is disclosed that includes a storage device containing a set of electronic components and an environmental condition recorder coupled to the storage device and associated with the set of electronic components. The environmental condition recorder includes sensing elements responsive to an ambient environmental condition, a processor and an associated memory storage device. The processor is configured to receive data from the sensing elements indicative of the ambient environmental condition during multiple, successive periods of time, to cumulatively and accessibly store the data in the associated memory storage device and to evaluate whether the electronic components are suitable for installation based on a cumulative effect of exposure to the ambient environmental condition.

In yet another broad aspect, a system is disclosed for evaluating a set of identical electronic components prior to installing the components into electronic assemblies. The system includes a storage device containing a set of identical electronic components, an environmental condition recorder coupled to the storage device and associated with the set of identical electronic components and a remote device comprising a processor and a memory storage unit. The environmental condition recorder is configured to collect data indicative of an environmental condition over multiple, successive periods of time and the processor is configured to receive the collected data from the environmental condition recorder and to evaluate whether the electronic components are suitable for installation based on the collected data.

In another broad aspect an article is disclosed that includes a computer-readable medium that stores computer executable instructions for causing a computer system to evaluate whether a set of electronic components are suitable for installation based on received time-based data representative of ambient moisture content associated with the set of electronic components.

In some implementations one or more of the following advantages may be present. The frequency of electronic component damage due to the expansion of trapped moisture during reflow and other manufacturing processes can be minimized. This can result in improved reliability of both electronic components and electronic assemblies.

An increase of available component historical data can enable users to make better informed decisions regarding whether to dry out electronic components prior to reflow. Consequently, the frequency of unnecessary baking can be decreased.

A better understanding of quality control management techniques can be developed and a subsequent manufacturing cost savings can be realized through improvements in manufacturing process efficiency.

Additionally, the collecting and interpreting of environmental data associated with electronic components prior to installation into an electronic assembly can be simplified.

Other features and advantages will be readily apparent from the following detailed description, the accompanying drawings and the claims.

BRIEF DESCRIPTION OF THE DRAWINGS

FIG. 7 is a prior art table containing total floor life estimating data.

FIG. 8 is a prior art table containing data indicating baking conditions.

DETAILED DESCRIPTION OF THE DRAWINGS

Figure 1:
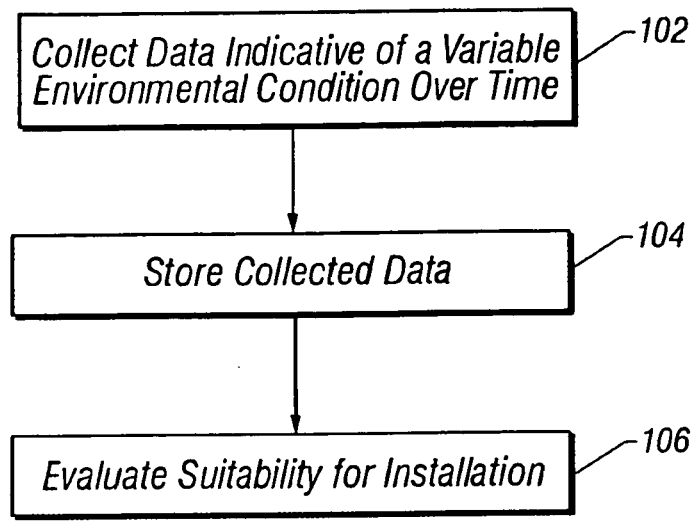
FIG. 1 is a flow diagram for evaluating a set of electronic components.

FIG. 1 outlines a method of evaluating a set of electronic components prior to installing any of the electronic components into an assembly. Such a set of components may include, for example, identical electronic components contained within a shipping package, attached to a reel assembly or contained within a storage carton for future installation into an electronic assembly.

The method of evaluating these components includes collecting 102 data indicative of a potentially variable environmental condition, such as ambient moisture content, over a period of time. Ambient moisture content may be sensed either directly or indirectly. For example, ambient moisture content may be measured directly as absolute humidity, expressed as a mass of water vapor in a given volume of air, commonly expressed in grams per cubic meter. Alternatively, a determination of ambient moisture content can be made based on measured values of temperature and relative humidity. Other methods of measuring or determining ambient moisture content also may be used.

The variation of environmental conditions that a set of electronic components is exposed to can be attributed to transporting the set from one place to another, each place having a different ambient environmental condition. Alternatively, an environmental condition can change at a single location, such as at a storage facility. Although such facilities typically include environmental control systems to regulate critical environmental conditions, these systems can have limited control abilities. Also, these systems can be prone to failure, consequently exposing the set of electronic components to potentially undesirable environmental conditions for potentially unacceptable lengths of time.

The method of evaluating the set of electronic components also includes storing 104 the collected data. Such storage of data can provide an indication of how a particular environmental condition varied over a length of time. Developing such an understanding can facilitate evaluating whether the set of electronic components can be expected to survive a printed circuit board assembly process and can therefore be considered to be suitable for installation.

The method also includes evaluating 106 the suitability for installation of the associated electronic components into an assembly. The suitability for installation can be adversely impacted by exposure to ambient moisture. The evaluating 106 can include, for example, estimating a remaining floor life associated with the set of electronic components. Remaining floor life can be described as an estimated amount of time that a moisture sensitive device can be exposed to a given set of environmental conditions without being susceptible to subsequent damage, for example, during reflow. Remaining floor life can be cumulatively decremented over time.

The evaluating 106 also can include determining a cumulative environmental exposure factor. Such a cumulative environmental exposure factor might be an integral function of ambient temperature and relative humidity over time. Such a factor can provide an arbitrary indication of the potential suitability of a set of electronic components for use in a printed circuit board assembly process after exposure to potentially detrimental environmental conditions.

The evaluating 106 also could include determining a reliability index indicative of an expected reliability associated with the set of electronic components. Such a reliability index might be calculated by a proportional function including a calculated environmental exposure factor in the numerator and an arbitrary benchmark value representative of an ideal reliability in the denominator. This reliability index could be expressed, for example as a fraction, a decimal or a percentage.

The evaluating 106 also could include comparing a calculated value quantifying an expected reliability with an arbitrary minimum acceptable value to ascertain a go/no-go type of determination regarding whether a particular set of electronic components are suitable for installation into an assembly.

Figure 2A:
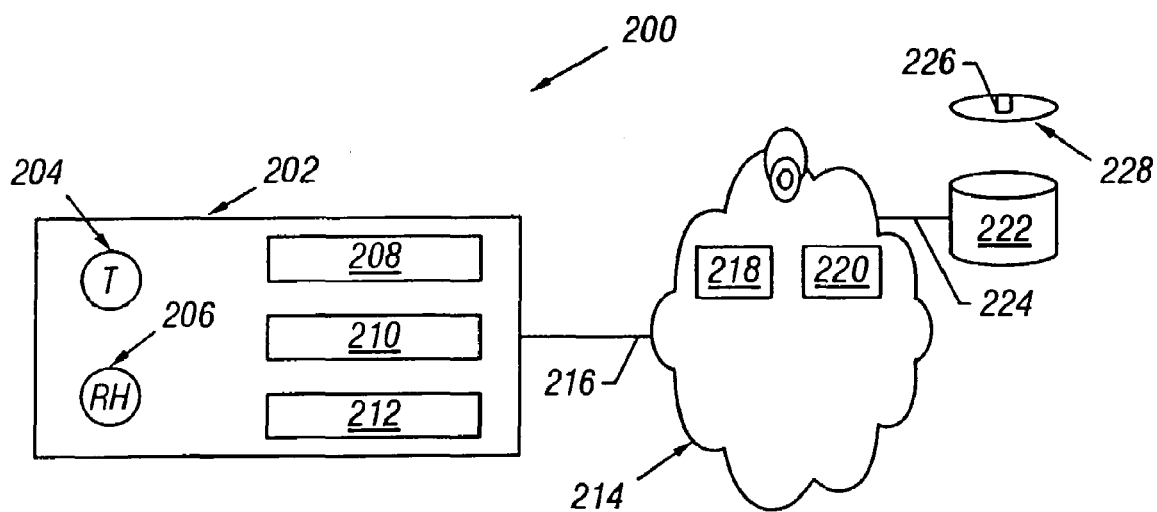
FIGS. 2A and 2B illustrate system block diagrams for evaluating a set of electronic components.

Referring now to the system 200 of FIG. 2A, the environmental condition recorder 202 includes a temperature-sensing element 204 responsive to ambient temperature and a relative humidity sensing element 206 responsive to ambient relative humidity. The sensing elements 204, 206 are responsive in real time. The environmental condition recorder 202 also includes an integral processor 208, a memory storage unit 210 and a timing element 212, which may be part of the processor 208. The processor 208 is configured to receive periodically sampled data from the sensing elements 204, 206 and to store that data in the memory storage unit 210.

The environmental condition recorder 202 can be coupled to a remote device 214 through a communications channel 216. The remote device 214 could be, for example, a computer, a personal digital assistant (PDA), or a paging device that includes a processor 218 and a memory storage unit 220. The communications channel 216 could be, for example, a wireless communications channel.

The remote device 214 also is coupled to a memory storage device 222 through the communications channel 224. The memory storage device 222 can be, for example, a disk drive and can read instruction 226 for the remote device 214 stored on a computer readable medium, such as the disk 228. Alternatively, the memory storage device could be a flash memory unit.

The environmental condition recorder 202 can be coupled to a set of electronic components intended for eventual installation into an electronic assembly. The environmental condition recorder 202 can collect data indicative of an ambient environmental condition the associated set is exposed to. The processor 208 can perform local processing of the data. Alternatively, the environmental condition recorder 202 can transfer collected data to the remote device 214 for processing.

Figure 2B:
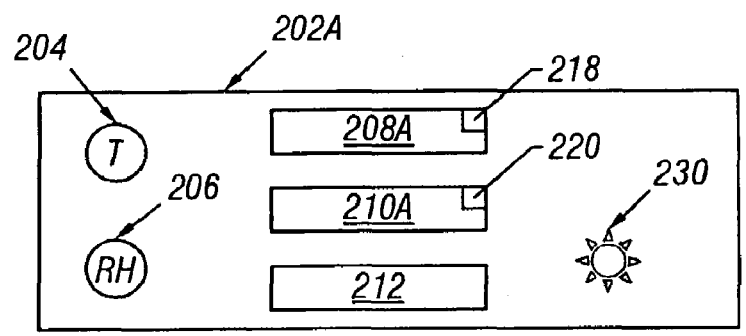

As shown in FIG. 2B, the functionality of the remote device's processor 218 and memory storage unit 220 could be incorporated into the local processor 208A and the memory storage unit 210A of the environmental condition recorder 202A. The environmental condition recorder 202A also includes an indicator 230, for example a light emitting diode (LED), to communicate positive/negative, go/no-go type data to a user examining the LED.

Figure 3A:
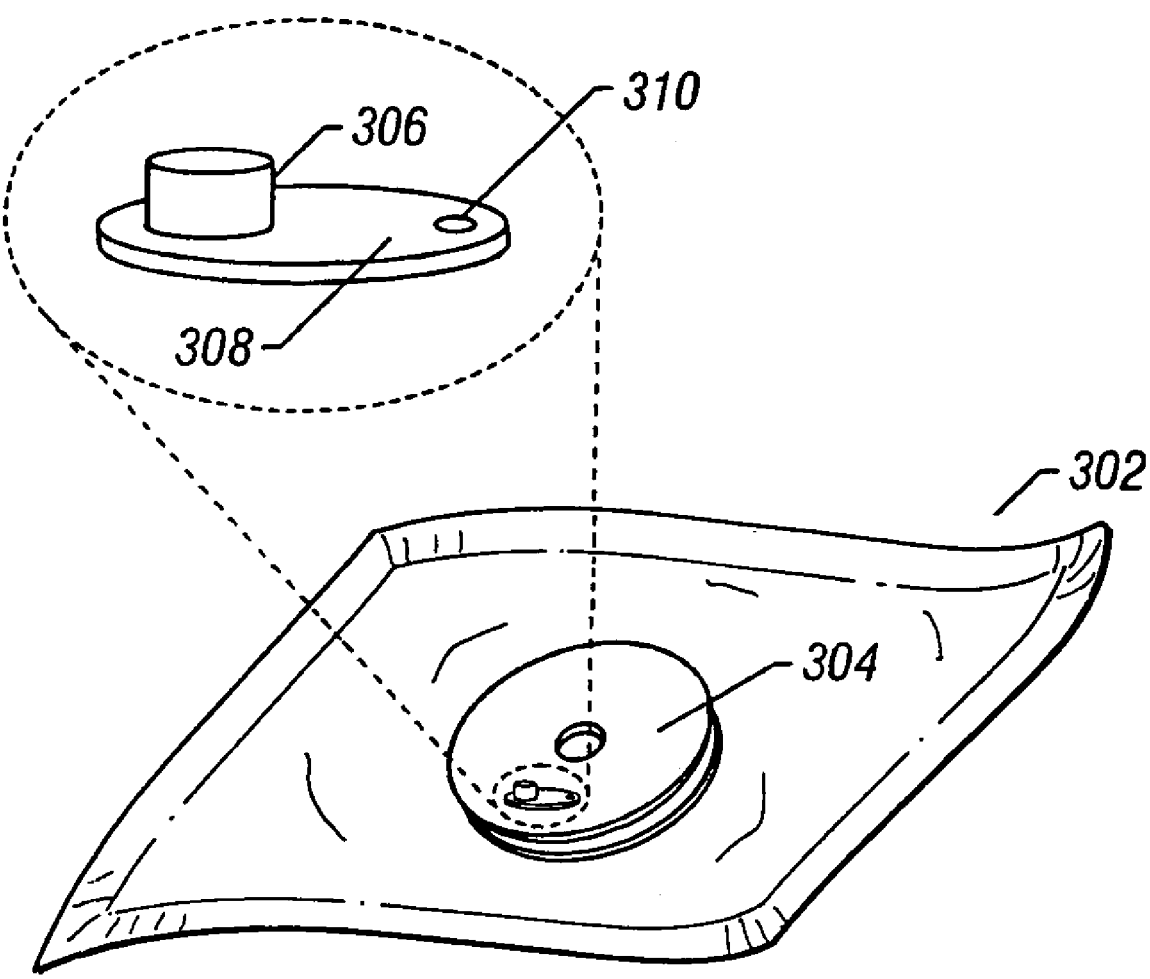
FIGS. 3A through 3E illustrate techniques for coupling an environmental condition sensor to a set of electronic components.

Referring to FIG. 3A, manufacturers of electronic components might attach an environmental condition recorder 202 to a reel 304 of electronic components inside a sealed compartment 302 for shipping. The environmental condition recorder 202 could be attached, for example, by using an adhesive material or by inserting the environmental condition recorder 202 into a storage pouch attached to the reel 304. The sealed compartment 302 can be used to ship and store either a reel 304 or several reels of electronic components.

Alternatively, a manufacturer might ship a reel 304 of electronic components in an airtight package 302 without an environmental condition recorder 202. In that case, the electronic assembly manufacturer might attach and reset an environmental condition recorder to the reel 304 of electronic components when the sealed package 302 is opened.

In certain embodiments, the environmental condition recorder 202 is a machine-readable computer chip in a stainless steel can 306 attached to a flange member 308 having an aperture 310. Each environmental condition recorder 202 has a unique identification number that can be read by an external machine. This unique identification number can be used as a unique identifier for the associated set of electronic components. The environmental condition recorder 202 also can be resettable.

Figure 3B:
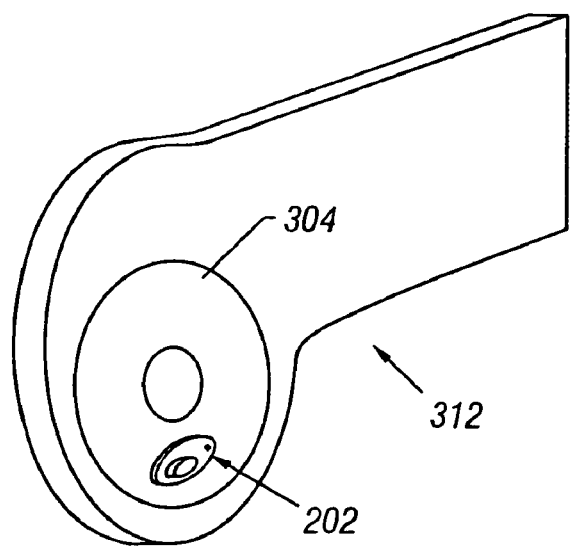

Referring now to FIG. 3B, the reel 304 of electronic components can be removed from the sealed compartment 302 and be mounted on a reel-type electronic component feeder 312.

Figure 3C:
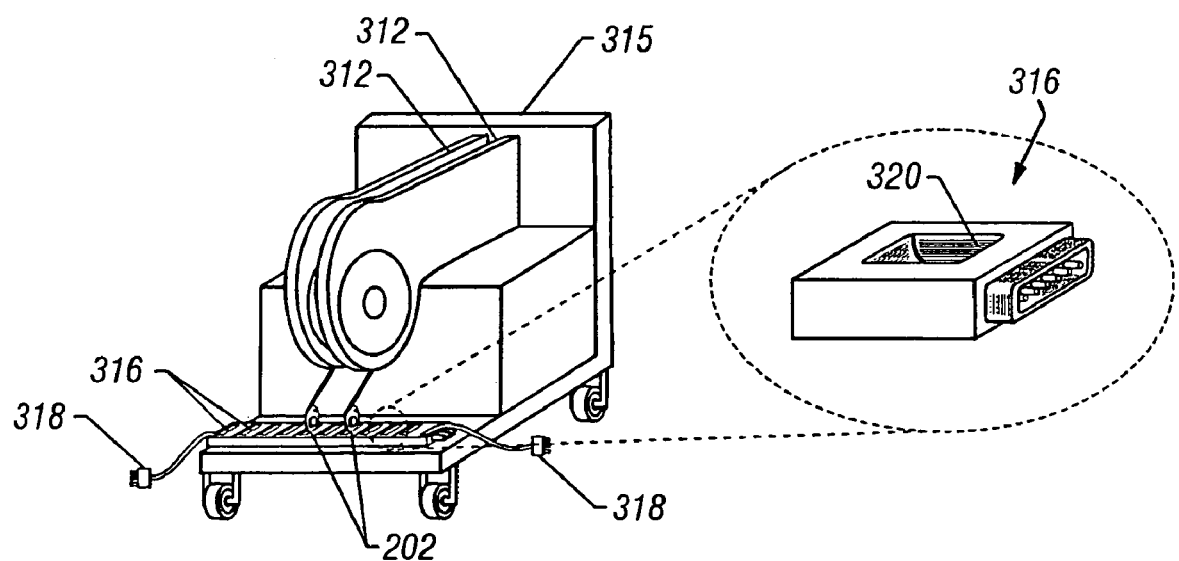

FIG. 3C illustrates a portable feeder bank 315 with two feeders 312 mounted in two of its slots. When the feeders 312 are mounted in their chosen slots, their associated environmental condition recorders 202 can be temporarily removed from each reel 304 and be placed in a corresponding reader 316 permanently mounted on the bank 315 adjacent each feeder slot. As the operator installs feeders 312 into the bank 315 to configure the bank 315 for a particular job, he inserts the environmental condition recorder 202 into appropriate readers 316 on the bank 315. The configuration of the feeder bank 315 may be completed before the bank is brought to a placement machine for docking. When the bank is docked, the string of readers 316 can be connected for communication with other component banks and a system controller via end connectors 318. Such communications may be accomplished over other media, such as a computer network.

Each reader 316 defines a receptacle 320 for receiving the environmental condition recorder 202. Each reader 316 also has both male and female serial connectors, one at either end, such that the readers 316 may be mechanically connected in a serial string having but one male and one female serial connector 318 for communication with other reader strings and a host computer. Each reader 316 contains a microprocessor (not shown) for reading the chip embedded within the environmental condition recorder 202. A reader 316 typically can be positioned anywhere on a feeder 312 or on a bank 315.

After installation of electronic components from the reel 304 into electronic assemblies, if there are still electronic components remaining on the reel 304, the environmental condition recorder 202 can be reattached to the reel 304, which can then be placed back into storage. Alternatively, if all electronic components of the reel 304 have been used, the environmental condition recorder 202 can be reset and subsequently be attached to a different set of electronic components. Resetting an environmental condition recorder 202 can include erasing its memory.

Figure 3D:
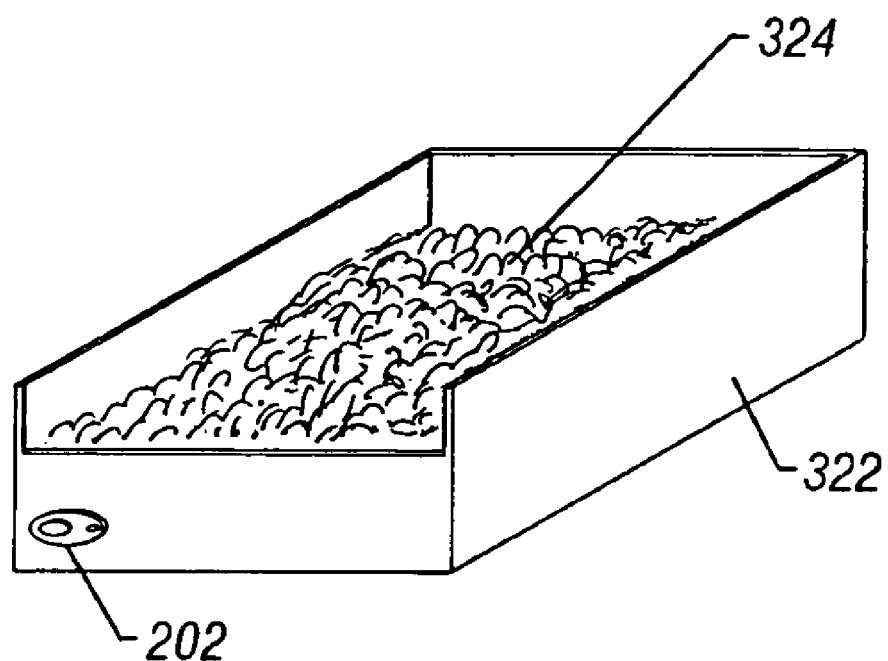

FIG. 3D illustrates a storage bin 322 with an environmental condition recorder 202 secured to it. The storage bin 322 contains a set 324 of discreet electronic components, and might be used at a factory or warehouse to store discreet components, sealed compartments 302 containing electronic components or reels 304 of electronic components. The environmental condition recorder 202 can be permanently attached to the storage bin 322 or removably attached using, for example, an adhesive.

Figure 3E:
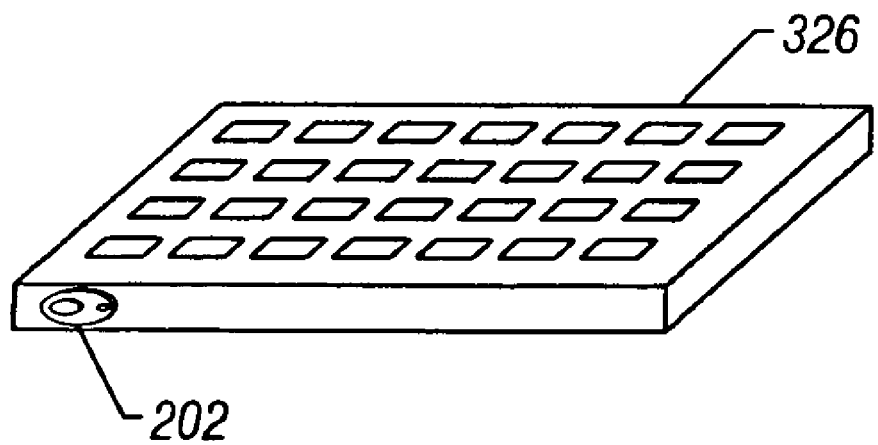

FIG. 3E shows a tray 326 of identical electronic components. An environmental condition recorder 202 is coupled to the tray. This coupling can be accomplished through the use of, for example, an adhesive or a clip connection.

Figure 4:
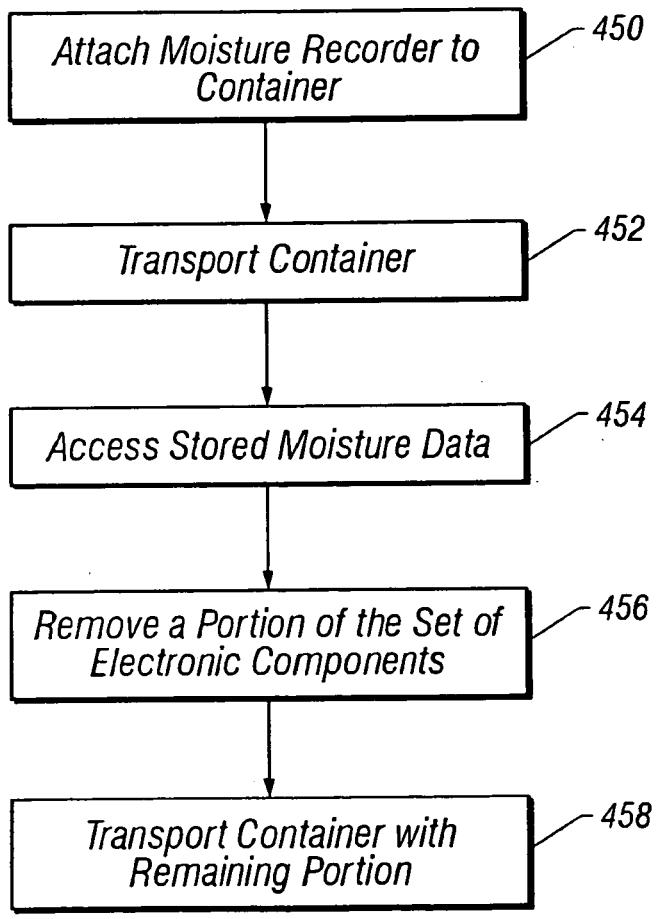
FIG. 4 is a flow diagram for monitoring and evaluating a set of electronic components throughout assembly.

Referring now to FIG. 4, a method of monitoring an environmental condition associated with a container containing a set of electronic components is described that includes attaching 450 an environmental condition recorder to the container. The environmental condition recorder can include a sensing element responsive to atmospheric moisture content, a memory storage device, and a processor electrically coupled to the sensing element and the memory storage device. The processor can be configured to periodically receive information from the sensing element indicative of atmospheric moisture content and to store data in the memory storage device based on the received information. The container and the attached environmental condition recorder can be transported 452 from a storage area to an assembly station where at least some of the electronic components can be installed into electronic assemblies. At the assembly station, the data stored in the memory storage device is accessed 454 by a memory reader at the assembly station. The memory reader at the assembly station can evaluate whether electronic components of the set of electronic components are suitable for installation into the electronic assemblies, based on the data accessed by the memory reader. A portion of the set electronic components can be removed 456 from the container for installation into the electronic assemblies at the assembly station. Then, the container with a remaining portion of the set of electronic components and the attached environmental condition recorder is transported 458 from the assembly station to the storage area.

Figure 5:
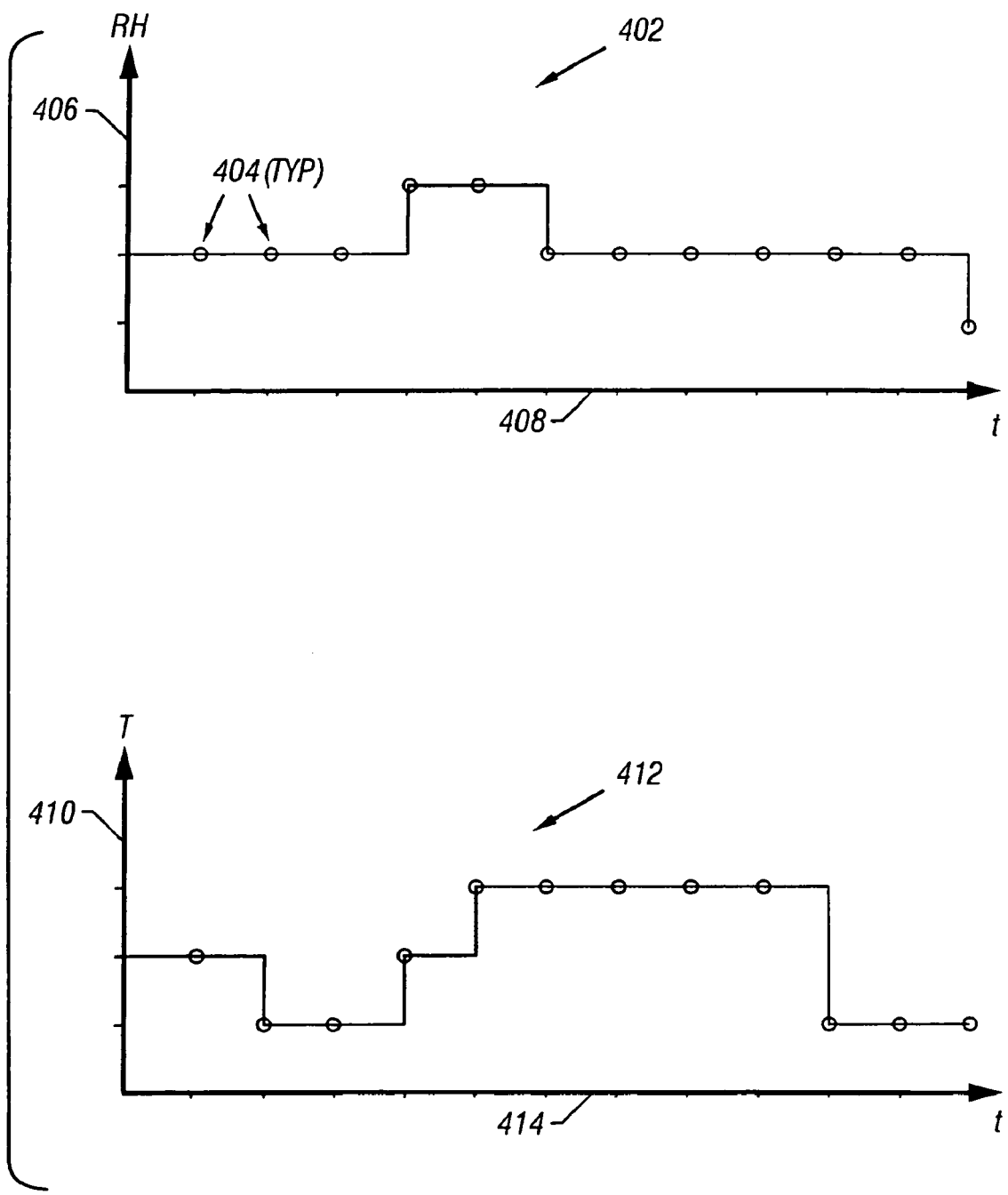
FIG. 5 provides environmental data represented graphically as a function of time.

FIG. 5 illustrates a graphical representation of environmental condition measurements recorded by an environmental condition recorder 202 over time. The processor 218, for example, can organize raw data received from the sensing elements 204, 206 into such a format. The vertical axis 406 (ordinate) of the upper graph 402 indicates ambient relative humidity and the horizontal axis 406 (abscissa) represents time. The upper graph 402 provides an indication of how the ambient relative humidity that a set of associated electronic components was exposed to varied over time. The points 404 on the graph indicate actual samplings of relative humidity. In order to maximize accuracy of the graph to most closely represent actual ambient conditions it may be desirable to reduce the time between sample points 404. However, doing so may hasten the depletion of available memory in the environmental condition recorder 202.

The vertical axis 410 (ordinate) of the lower graph 412 indicates ambient temperature and the horizontal axis 414 (abscissa) represents time. The lower graph 412 provides an indication of how the ambient temperature that a set of associated electronic components was exposed to varied over time. The time axis 414 of the lower graph is the same as the time axis of the upper graph 408. So it is possible to estimate both the ambient relative humidity and the ambient temperature at any point along the illustrated time axes. Such information can be used to determine the ambient moisture content that the associated set of electronic components was exposed to at each point along the illustrated axes. The information illustrated in the graphs may be outputted from an environmental condition recorder 202 to a remote device 214 or may be stored in a memory storage unit 210 of the environmental condition recorder 202 for local processing.

Figure 6A:
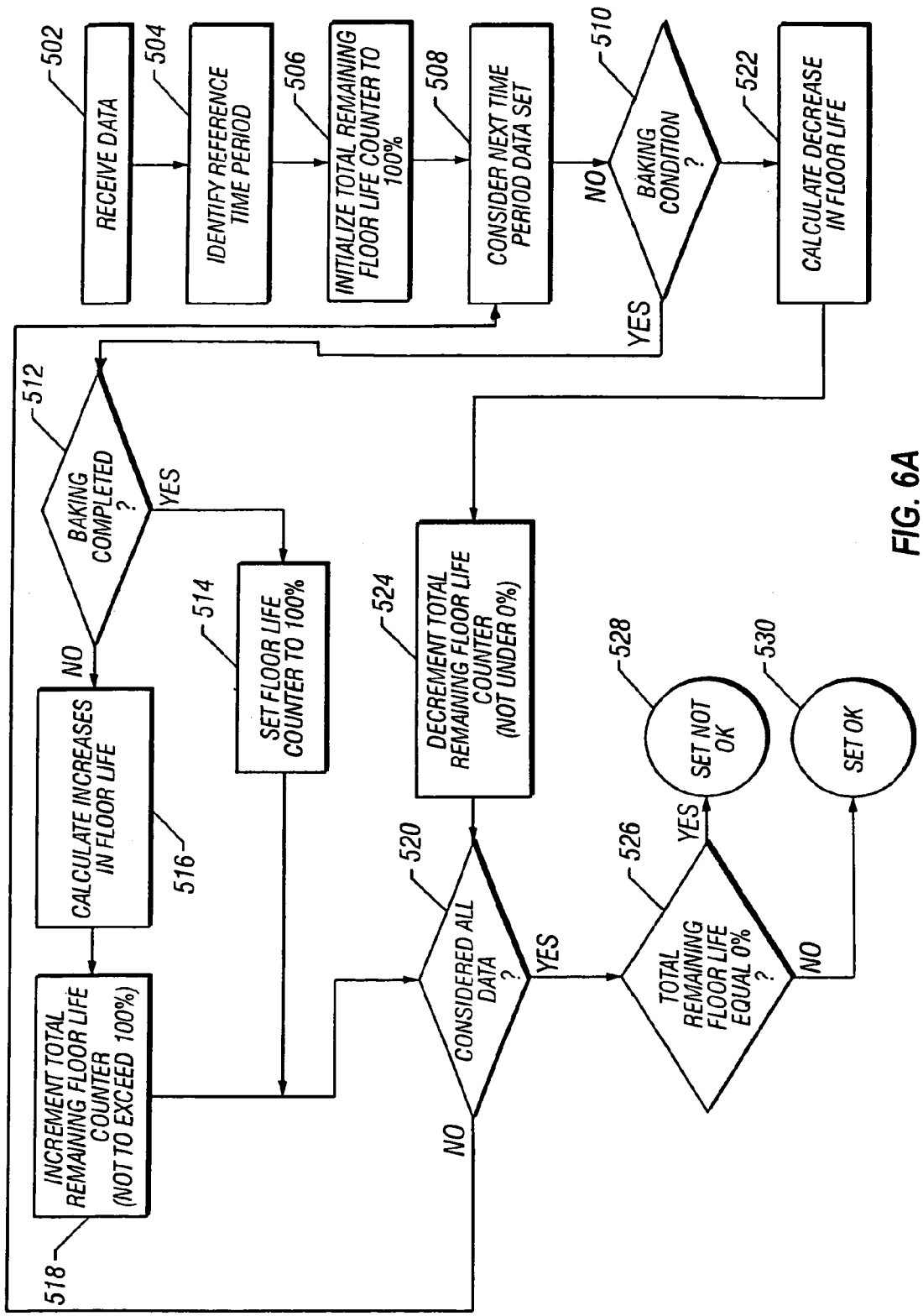
FIGS. 6A and 6B are flow diagrams for processing data to evaluate a set of electronic components.

With reference to the flowchart of FIG. 6A, a processor receives 502 data, for example graphical data representing recorded relative humidity values and recorded temperature values associated with a set of electronic components over time. The received data provides an indication of ambient moisture content variation over time. As outlined above, the processor may be part of a remote device or may be integral to an environmental condition recorder. If the processor is remotely located the data can be received over a communications channel such as an RS232 connection or a wireless connection. If the processor is integral with the environmental condition recorder 202A the data can be read directly from the memory storage unit 210A.

The processor can identify 504 a reference time to start calculating a remaining floor life of the associated set. This reference time can be, for example, associated with a time that remaining floor life is assumed to be undiminished and can be used as a baseline for calculating subsequent decrements to remaining floor life. This reference time may be identified by applying an algorithm to the received graphical data to identify a time that the set of electronic components had been exposed to drying conditions, that is a temperature and/or relative humidity above a predetermined value for a predetermined length of time to effectively reset the remaining floor life to 100%. Alternatively, the reference time can be the time associated with the first or last measured data values. For illustrative purposes, it can be assumed that the reference time period corresponds to the first measured set of data values.

The processor initializes 506 a counter representative of a total remaining floor life, for example, by setting the value in the counter to 100%. In one implementation, this value in the counter is a percentage that represents a remaining floor life. The counter can be decremented for each reduction of floor life the associated set of electronic components experiences. In a particular implementation, each set of temperature and relative humidity measurements recorded by the environmental condition recorder 202 indicates a quantity of moisture present in the ambient environment. If the quantity of moisture exceeds a particular value, the total remaining floor life is reduced. If the quantity of moisture is below a certain value, the total remaining floor life is increased. If the value in the total remaining floor life counter reaches 0%, the remaining floor life associated with the set of electronic components is assumed to be 0%. If the value in the total remaining floor life counter is 100%, the remaining floor life associated with the set of electronic components is assumed to be 100%.

The processor considers 508 a set of data points, for example data points representative of the first recorded time period and determines 510 whether the data indicates a baking condition. Environmental parameters identifying a baking condition can be based on industry standard information. A baking condition can be indicated, for example, by a specific combination of temperature and relative humidity values that may result in a drying effect applied to the associated electronic components.

If the processor determines 510 that a drying or baking event is not represented by the data, the processor calculates 522 a decrease in floor life. Such a calculation can be based on industry available standards or other guidelines. The processor then decrements 524 the total remaining floor life counter an appropriate amount, based on the calculation. The total remaining floor life counter should be configured to store only values between 0% and 100%. Any attempts to increment or decrement the value stored in the counter to outside that range should be ignored.

If the processor determines 510 that a drying or baking event occurred, the processor then determines 512 whether the baking cycle is complete. A baking cycle can be considered complete if, for example, the value in the total remaining floor life counter is equal to 100%. Additionally, industry standard practices provide guidelines detailing criteria for completing a baking cycle. If the baking cycle is completed, the processor sets 514 the value in the remaining floor life counter to 100%.

If the processor determines 512 that the bake cycle is not complete, the processor calculates 516 an increase in remaining floor life based on the data associated with the time period being considered. Such a calculation can be made by using industry standard guidelines. The processor then increments 518 the value in the total remaining floor life counter an amount equal to the calculated increase in floor life. The maximum allowable value to be stored in the total remaining floor life counter is 100%. Any attempt to increment the value beyond this amount should be ignored.

Next, the processor determines 520 whether all recorded data has been considered. If the processor determines 520 that all recorded data has not been considered, the processor repeats the steps outlined above for data associated with the next recorded time period. If the processor determines 520 that all data has been considered, the processor determines 526 whether the value in the total remaining floor life counter is equal to 0%. If the value is equal to 0%, the processor concludes 528 that the associated set of electronic components is not acceptable for installation into an assembly. If the value in the total remaining floor life counter is greater than 0%, the processor concludes 530 that the associated set of electronic components are suitable for installation into an electronic assembly.

Figure 6B:
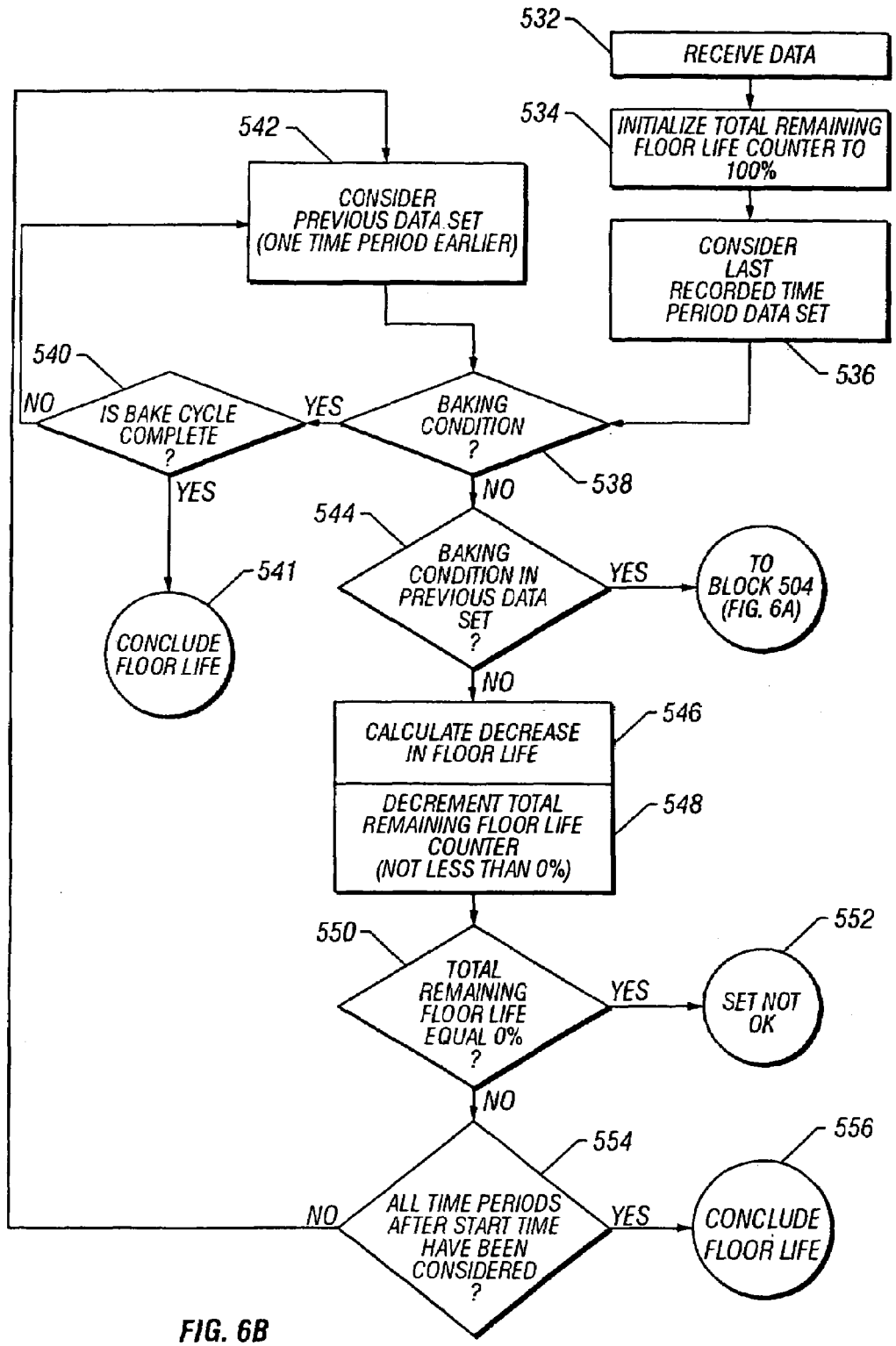

FIG. 6B outlines an enhancement of the method described above that might, in certain instances, provide a more rapid determination of suitability for installation of a set of electronic components based on a set of data indicative of ambient moisture content over time.

First, the processor receives 532 data indicative of ambient moisture content over time. The processor initializes 534 the value in the total remaining floor life counter, for example, by setting the value to 100%. The processor then considers 536 the last recorded time period data set and determines 538 whether the data indicates a baking condition or not. If the processor determines 538 that the data indicates a baking condition, the processor then considers 540 whether the set of electronic components had been exposed to a complete bake cycle, resulting in a complete resetting of floor life. If the set of electronic components had been exposed to a complete bake cycle, the processor concludes 541 that an amount of life is remaining equal to the amount of life indicated by the value in the remaining floor life counter prior to considering the baking condition.

If the processor determines 540 that the bake cycle is not complete, the processor considers 542 data associated with the previous time period. This cycle can continue until the processor determines 540 that the baking cycle is complete or until an uncompleted baking cycle has ended.

If the processor determines 538 that a baking condition is not indicated by a set of data being considered, the processor determines 544 whether the previously considered set of data indicated a baking condition. If the previously considered set of data indicated a baking condition then the electronic components were probably exposed to some limited, but not complete baking cycle. The processor then identifies 504 a reference time period (i.e., the first time period) and proceeds as described above with reference to FIG. 6A.

Referring again to FIG. 6B, if the processor determines 544 that the previous set of data did not indicate a baking, then the processor calculates 546 a decrease in floor life associated with the set of data being considered and decrements 548 the total remaining floor life counter accordingly. The total remaining floor life counter should be configured to store any value between 0% and 100%. Attempts to decrement the value stored in the counter to less than 0% should be ignored.

The processor then considers 550 whether the value in the total remaining floor life counter is equal to 0%. If the value is 0%, the processor can conclude 552 that the associated set of electronic components is not suitable for installation into electronic assemblies. If the value in the total remaining floor life counter is greater than 0%, the processor determines 554 whether all time recorded time periods have been considered. If all periods have been considered, the processor can conclude 556 an estimated remaining floor life based on the value stored in the total remaining floor life counter. If all time periods have not been considered, the processor can consider 542 data associated with another time period, one time period earlier.

After concluding an estimated floor life or a suitability for installation of the associated electronic components, the processor can output data indicative of its conclusion. The data outputted by the processor can be stored in a memory storage device, displayed on a screen, used to illuminate a light emitting diode or can be transmitted to an automatic controller configured to perform specific actions. An automatic controller might, for example, stop a reflow operation in response to data indicating a low remaining floor life associated with a set of electronic components.

FIG. 7 shows an excerpted table 602 from IPC/JEDEC J-Std-033 Joint Industry Standard, April 1999 that includes information that, depending on the specific system architecture, could be stored either in a local memory storage unit, such as 210A or in a remote memory storage unit such as 220. A processor could use the information included in the table 602 to estimate reductions in remaining floor life.

The table 602 provides equivalent derated floor lives (measured in days) applicable to various electronic components exposed to environmental relative humidity values 604 ranging from 20–90% RH and temperatures 606 of 20° C., 25° C. and 30° C. The table 602 is specifically applicable to SMDs, molded with novolac, biphenyl or multifunctional epoxy mold compounds, however, similar information is available for use with other technologies and materials. The table 602 also indicates that the body thickness 608 and the moisture sensitivity level (M.S. Level) 610 of electronic components can influence its associated total equivalent floor life. These variables are dependent on specific characteristics of each set of electronic components. This information indicating the body thickness 608 and the moisture sensitivity level 610 can be programmed into an associated environmental condition recorder 202 for automatic reading.

FIG. 8 provides a second excerpted table 802 from IPC/JEDEC J-Std-033 Joint Industry Standard, April 1999 that includes information that also can be stored in a memory storage unit, such as 210A. The processor also could use the information included in the table 802 to identify baking events that a set of electronic components were exposed to.

The information details component-drying conditions. If the processor identifies a period of time in recorded data that satisfies the conditions described in the table 802, it can be assumed that degradation of floor life began after that period.

The data included in the table 802 can be used to derive an estimation of an increase in the estimated floor life associated with a set of electronic components.

Figure 9:
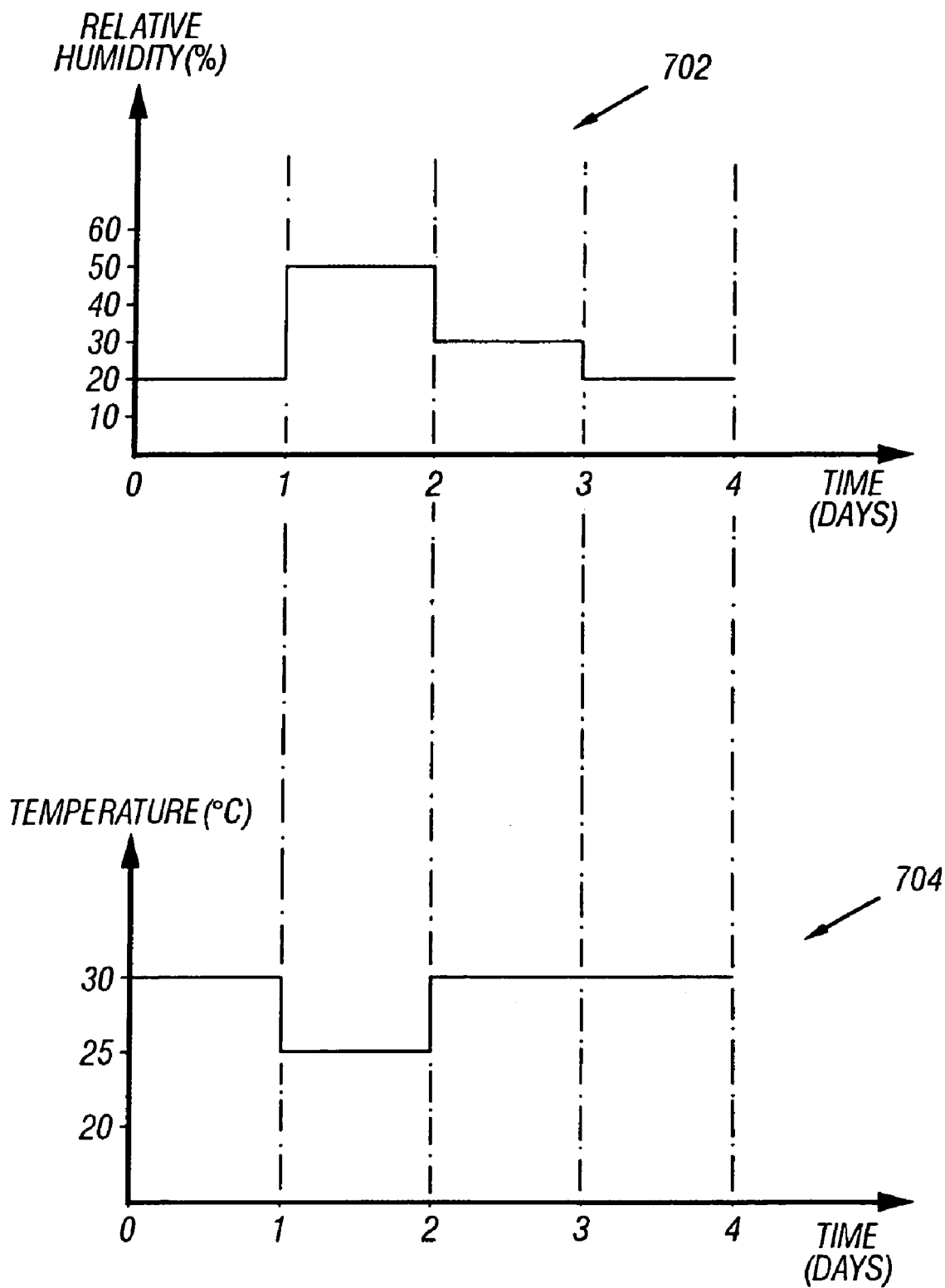
FIG. 9 provides an illustrative example of data represented graphically as a function of time.

FIG. 9 provides a specific graphical representation of environmental condition measurements taken over time period of four days for an associated set of electronic components. The graphical representation can be used to illustrate the concepts discussed above. The upper graph 702 indicates relative humidity measurements taken over time and the lower graph 704 indicates temperature measurements taken over time. The time units are indicated on the horizontal axis as days. Data similar to this may be outputted from an environmental condition recorder 202 for further processing by a remote device or may be further processed by an integral processor in the environmental condition recorder 202.

The processor first receives the graphical data and data indicating the body thickness and the moisture sensitivity level of the electronic components of the subject set. All of this data can be read from an environmental condition recorder 202. For illustrative purposes, it can be assumed that the data indicates a body thickness of 2.5 millimeters and a moisture sensitivity 610 of Level 4. The processor then initializes an associated remaining floor life counter by setting the value in the counter to 100%.

The processor considers the set of data corresponding to the last recorded period of time. The processor determines that the environmental condition (i.e., a temperature of 30° and a relative humidity of 20%) does not represent a baking condition. The processor also considers whether a partial baking event may have occurred. The processor does this by considering whether a baking condition is indicated by a set of data in a later time period than the time period being considered.

Next, the processor calculates a reduction in floor life during the period of time associated with the last set of data points, which is the period from the day 3 to day 4. During that period, the data indicates a temperature of 30° C. and a relative humidity of 20%. The processor can refer to information stored in the memory storage unit based on table 602 and determine that the equivalent total floor life under such an environmental condition is 5 days. Since the length of the associated time period is 1 day, the processor can determine that the floor life reduction factor associated with the last time period is equal to 1 day/5 days or 20%. The processor decrements the value stored in the total remaining floor life counter by 20%. The stored value is then 80%.

Since the value in the total remaining floor life counter is not equal to 0%, and all recorded time periods have not been considered, the processor considers data points corresponding to the previous time period. The previous set of data also does not represent a baking condition. The processor calculates the floor life reduction factor associated with the data, from day 2 to day 3. During that period, the data indicates a temperature of 30° C. and a relative humidity of 30%. Referring to the stored data corresponding to the data of table 602, the equivalent total floor life for the electronic components under this environmental condition is 4 days. The length of time associated with this period is 1 day. Therefore, the floor life reduction associated with that time period can be estimated as 1 day/4 days, or 25%. The processor then decrements the total remaining floor life counter by 25% so the value is then 55%.

Since the value stored in the total remaining floor life counter is not less than 0%, all of the relevant time periods still have not been considered, and the data points of the previous time period do not represent a baking event, the processor estimates the floor life reduction factor during the previous period from day 1 to day 2. During that time, the data indicates a temperature of 25° C. and a relative humidity of 50%. Referring again to the data of table 602, the equivalent total floor life for the electronic components under this environmental condition is 4 days. Accordingly, the processor determines that 25% of floor life expired over the one day time period under these conditions. The processor then decrements the total remaining floor life counter an additional 25% to 30%.

Once again, the total floor life reduction factor still is not equal to 0%, all of the relevant time periods have not yet been considered and the data points associated with previous period do not indicate the occurrence of a baking event. The processor calculates a reduction in floor life from day 0 to day 1. During that time period, the data indicates a temperature of 30° C. and a relative humidity of 20%. Referring again to the data of table 602, the equivalent total floor life for the electronic components under this environmental condition is 5 days. Accordingly, the processor determines that 20% of floor life is depleted over the one day time period under such conditions. The processor then decrements the value stored in the total remaining floor life counter an additional 20% to 10%.

The value stored in the total remaining floor life counter is still not equal to 0%, however, all of the relevant time periods have been considered. Therefore, the processor concludes that 10% floor life is remaining for the associated set of electronic components. The processor can compare the value of 10% with a minimum acceptable value or it can be further processed to convert the percentage of remaining floor life to an amount of floor life remaining expressed in days or hours under specified environmental conditions. For example, if the electronic components discussed above are expected to be stored in an environment of 20% relative humidity and 30° C. for 6 hours (0.25 days), referring again to table 602, the total additional degradation of floor life can be estimated as 0.25 days/5 days=5%. This may or may not be considered acceptable.

Various features of the techniques described can be modified. For example, the environmental condition sensors can be configured to communicate with a reflow machine to either allow or disallow reflow to occur based on an evaluation of the recorded data. Other standards and guidelines for estimating remaining floor life can be implemented. Other data, such as part numbers and serial numbers, related to an associated set of electronic components can be stored in the memory storage unit 210 of the environmental condition recorder 202. The processor 208 might be capable of formatting the collected data into other formats, such as a histogram. The processor 208 might be configured to go into a "sleep mode" between sampling times, this can extend the life of a battery supplying power to the environmental condition recorder 202. The memory storage unit 210 of the environmental condition recorder 202 can be erasable and reusable.

Various features of the system can be implemented in hardware, software or a combination of hardware and software. For example, some features of the system can be implemented in computer programs executing on programmable computers. Each program can be implemented in a high level procedural or object oriented programming language to communicate with a computer system. Furthermore, each such computer program can be stored on a storage medium, such as read-only-memory (ROM) readable by a general or special purpose programmable computer or processor, for configuring and operating the computer when the storage medium is read by the computer to perform the functions described above.

A number of implementations of the invention have been described. Nevertheless, it will be understood that various modifications may be made without departing from the spirit and scope of the invention. Accordingly, other implementations are within the scope of the following claims.

What is claimed is:

1. A method of monitoring an environmental condition associated with a container containing a set of electronic components, the method comprising:
    attaching an environmental condition recorder to the container, the environmental condition recorder comprising a sensing element responsive to atmospheric moisture content, a memory storage device, and a processor electrically coupled to the sensing element and the memory storage device, the processor being configured to periodically receive information from the sensing element indicative of atmospheric moisture content and to store data in the memory storage device based on the received information; and
    transporting the container and the attached environmental condition recorder from a storage area to an assembly station for installing the electronic components into electronic assemblies.

2. The method of claim 1 further comprising accessing the data in the memory storage device with a memory reader at the assembly station.

3. The method of claim 2 further comprising evaluating, with the memory reader at the assembly station, whether electronic components of the set of electronic components are suitable for installation into the electronic assemblies, based on the data accessed by the memory reader.

4. The method of claim 1 further comprising removing a portion of the set of electronic components from the container for installation into the electronic assemblies at the assembly station.

5. The method of claim 4 further comprising transporting the container containing a remaining portion of the set of electronic components and the attached environmental condition recorder from the assembly station to the storage area.

6. The method of claim 1 further comprising:
    after transporting the container and the attached environmental condition recorder from the storage area to the assembly station, removing the environmental condition recorder from the container; and
    attaching the environmental condition recorder to a second container of electronic components.

7. The method of claim 6 further comprising:
    after attaching the environmental condition recorder to the second container of electronic components, sensing the second container's electronic components' exposure to atmospheric moisture content with the attached environmental condition recorder prior to installing the electronic components of the second set into electronic assemblies.

8. The method of claim 1 further comprising sensing the electronic components' exposure to ambient moisture content with the sensing element of the attached environmental condition recorder.

9. The method of claim 1 further comprising storing data in the memory storage device based on the information received by the processor.

10. The method of claim 1 wherein the container of electronic components stores only electronic components that are identical to each other.

11. The method of claim 1 further comprising removing the environmental condition recorder from the container just prior to installing the electronic components into the electronic assemblies.

* * * * *